(12) United States Patent
Pan et al.

(10) Patent No.: US 9,795,041 B1
(45) Date of Patent: Oct. 17, 2017

(54) ELECTRONIC DEVICE PACKAGING BOX

(71) Applicant: BOTHHAND ENTERPRISE INC., Tainan (TW)

(72) Inventors: Yung-Ming Pan, Taoyuan (TW); Chung-Cheng Fan, Taoyuan (TW)

(73) Assignee: BOTHHAND ENTERPRISE INC., Tainan (TW)

( * ) Notice: Subject to any disclaimer, the term of this patent is extended or adjusted under 35 U.S.C. 154(b) by 0 days.

(21) Appl. No.: 15/372,065

(22) Filed: Dec. 7, 2016

(30) Foreign Application Priority Data

Sep. 1, 2016 (TW) .............................. 105128214 A

(51) Int. Cl.
 *H05K 5/00* (2006.01)
 *H05K 7/14* (2006.01)
 *H05K 5/03* (2006.01)
 *H01F 27/04* (2006.01)

(52) U.S. Cl.
 CPC ........... *H05K 5/0013* (2013.01); *H01F 27/04* (2013.01); *H05K 5/0091* (2013.01); *H05K 5/03* (2013.01); *H05K 7/1417* (2013.01)

(58) Field of Classification Search
 CPC ........ H05K 5/0091; H01F 27/04; H01F 27/02
 See application file for complete search history.

(56) References Cited

U.S. PATENT DOCUMENTS

| | | | | |
|---|---|---|---|---|
| 3,155,766 A | * | 11/1964 | Eichert | H05K 5/0091 174/552 |
| 3,359,461 A | * | 12/1967 | Chapman | H05K 5/00 361/714 |
| 4,039,901 A | * | 8/1977 | Adler | H05K 5/0091 174/521 |
| 6,946,942 B1 | * | 9/2005 | Chih-Min | H01F 19/00 336/105 |
| 7,236,075 B1 | * | 6/2007 | Liu | H01F 27/027 336/90 |
| 2007/0262442 A1 | * | 11/2007 | Chen | H01F 27/292 257/706 |
| 2007/0279172 A1 | * | 12/2007 | Huang | H01F 27/022 336/90 |
| 2009/0273908 A1 | * | 11/2009 | Tsao | H01F 27/022 361/748 |
| 2013/0076455 A1 | * | 3/2013 | Chen | H01F 17/062 333/181 |
| 2015/0179328 A1 | * | 6/2015 | Edwards | H01F 27/292 336/90 |
| 2016/0183400 A1 | * | 6/2016 | Pan | H01F 27/04 361/752 |

* cited by examiner

*Primary Examiner* — Hung V Ngo
(74) *Attorney, Agent, or Firm* — Hamre, Schumann, Mueller & Larson, P.C.

(57) ABSTRACT

An electronic device packaging box includes a first base, a second base and a connecting unit. The first base includes two side walls spaced apart from each other in a first direction and each having a first side receiving space, and a connecting wall interconnecting the side walls to define a receiving space. The second base is received in the receiving space, and includes spaced-apart top and bottom walls, and a separating wall interconnecting the top and bottom walls to define two second side receiving spaces. The connecting unit includes two first connecting subunits, each of which is mounted to a respective one of the side walls, and two second connecting subunits, which are mounted to the bottom wall.

7 Claims, 7 Drawing Sheets

ELECTRONIC DEVICE PACKAGING BOX

CROSS-REFERENCE TO RELATED APPLICATION

This application claims priority of Taiwanese Patent Application No. 105128214, filed on Sep. 1, 2016.

FIELD

The disclosure relates to an electronic device packaging box, and more particular to an electronic device packaging box that occupies less area of a carrier plate when the electronic device packaging box is mounted to the carrier plate.

BACKGROUND

Referring to FIGS. 1 and 2, a conventional electronic device packaging box 1 according to Taiwanese Utility Model Patent No. M342655 is used for being installed with a plurality of coils 10. The conventional electronic device packaging box 1 includes a first base 11, a second base 12 that is connected to the first base 11 in an up-down direction, a plurality of connecting pin units 13 that are mounted to the first base 11 and the second base 12, and a cover 14 that covers the first base 11, the second base 12 and the connecting pin units 13.

The first base 11 includes two mounting units 111 that are spaced apart from each other in a first direction 15, and a connecting plate 112 that interconnects the mounting units 111. Each of the mounting units 111 includes two first mounting seats 113 that are spaced apart from each other in a second direction 16, and a first receiving space 114 that is disposed between the first mounting seats 113 of the mounting unit 111 and that receives corresponding ones of the coils 10. The connecting plate 112 has four insertion hole units 115 that are spaced apart from each other in the second direction 16. Each of the insertion hole units 115 has a plurality of insertion holes 116 that are spaced apart from each other in the first direction 15. The second base 12 includes two second mounting seats 121 that are spaced apart from each other in the second direction 16, and a second receiving space 122 that is disposed between the second mounting seats 121 and that receives corresponding ones of the coils 10.

The connecting pin units 13 are spaced apart from each other in the second direction 16. Each of the connecting pin units 13 includes a plurality of connecting pins 131 that are spaced apart from each other in the first direction 15. Some of the connecting pins 131 of each of the connecting pin units 13 are mounted to the first mounting seats 113 of the mounting units 111, and the remaining connecting pins 131 of the connecting pin unit 13 is mounted to the second mounting seats 121 of the second base 12.

Since the first receiving spaces 114 of the mounting units 111 are aligned with the second receiving space 122 of the second base 12 in the first direction 15, and the connecting pins 131 of each of the connecting pin units 13 are arranged in the first direction 15, the overall length of the conventional electronic device packaging box 1 is increased, especially in the circumstances where a larger number of the connecting pins 131 is needed. Thus, the conventional electronic device packaging box 1 is unfavorable for being used to be mounted to a circuit board with limited sizes.

SUMMARY

Therefore, an object of the present disclosure is to provide an electronic device packaging box that can alleviate at least one of the drawbacks associated with the prior art.

According to the present disclosure, an electronic device packaging box is adapted for electrically interconnecting a carrier plate and an inductance unit.

The electronic device packaging box includes a first base, a second base and a connecting unit.

The first base includes two side walls, a connecting wall and a receiving space. The side walls are spaced apart from each other in a first direction, and each have a first side receiving space. The connecting wall interconnects the side walls. The receiving space is defined by the side walls and the connecting wall, and is adapted to open toward the carrier plate. The second base is received in the receiving space of the first base, and includes a top wall, a bottom wall, a separating wall and two second side receiving spaces. The bottom wall is spaced apart from the top wall. The separating wall interconnects the top wall and the bottom wall. The second side receiving spaces are defined by the top wall, the bottom wall and the separating wall, and are spaced apart from each other in the first direction. The connecting unit includes two first connecting subunits and two second connecting subunits. Each of the first connecting subunits is mounted to a respective one of the side walls of the first base. The second connecting subunits are mounted to the bottom wall of the second base and are spaced apart from the first connecting units in the first direction. Each of the first connecting subunits includes a plurality of first connecting members that are spaced apart from each other in a second direction. Each of the second connecting subunits includes a plurality of second connecting members that are spaced apart from each other in the second direction.

At least one of the first side receiving spaces of the side walls and the second side receiving spaces is adapted for receiving at least a portion of the inductance unit therein.

BRIEF DESCRIPTION OF THE DRAWINGS

Other features and advantages of the present disclosure will become apparent in the following detailed description of the embodiment and variation with reference to the accompanying drawings, of which.

DETAILED DESCRIPTION

Figure 1:
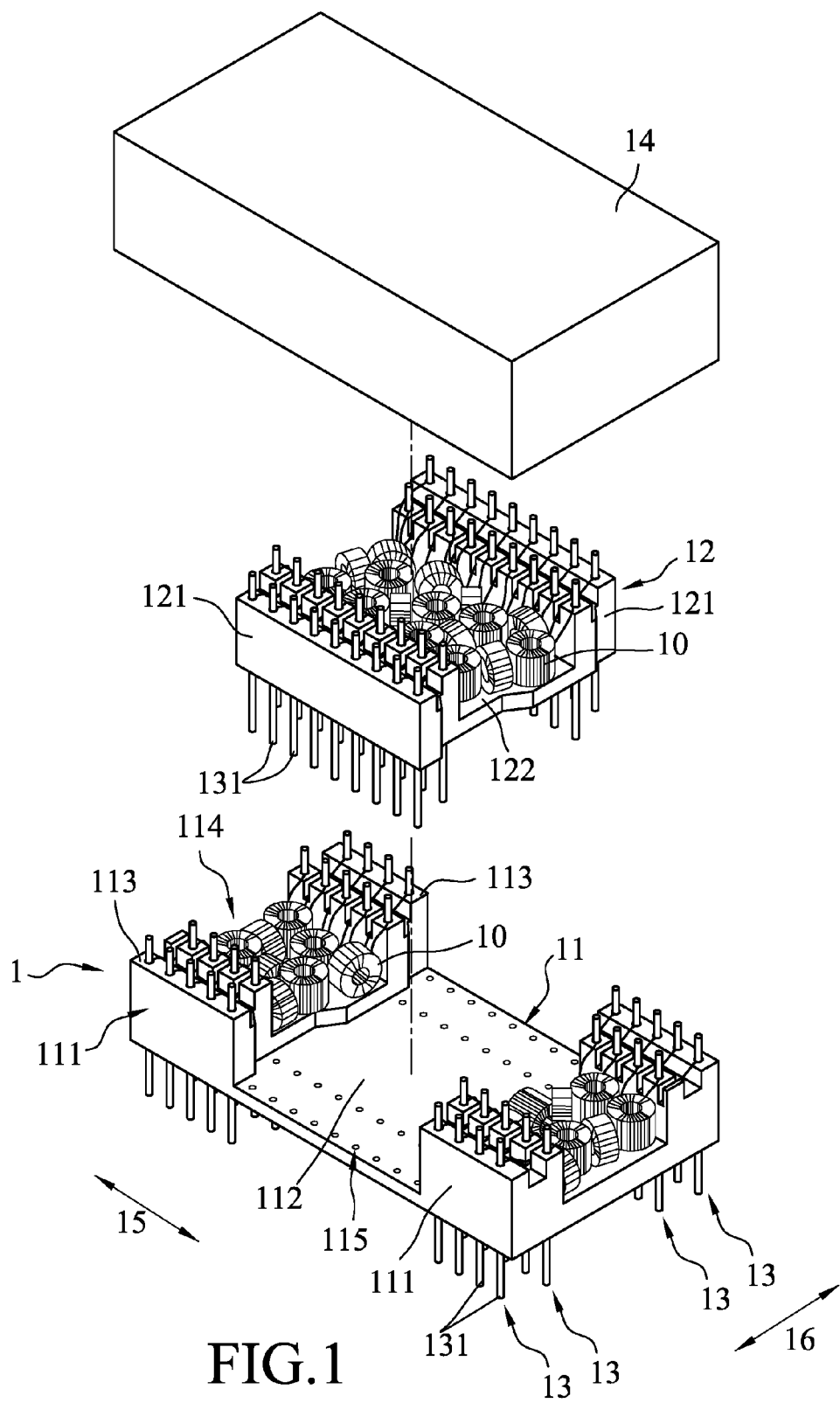
FIG. 1 is an exploded perspective view of a conventional electronic device packaging box according to Taiwanese Utility Model Patent No. M342655.
Figure 2:
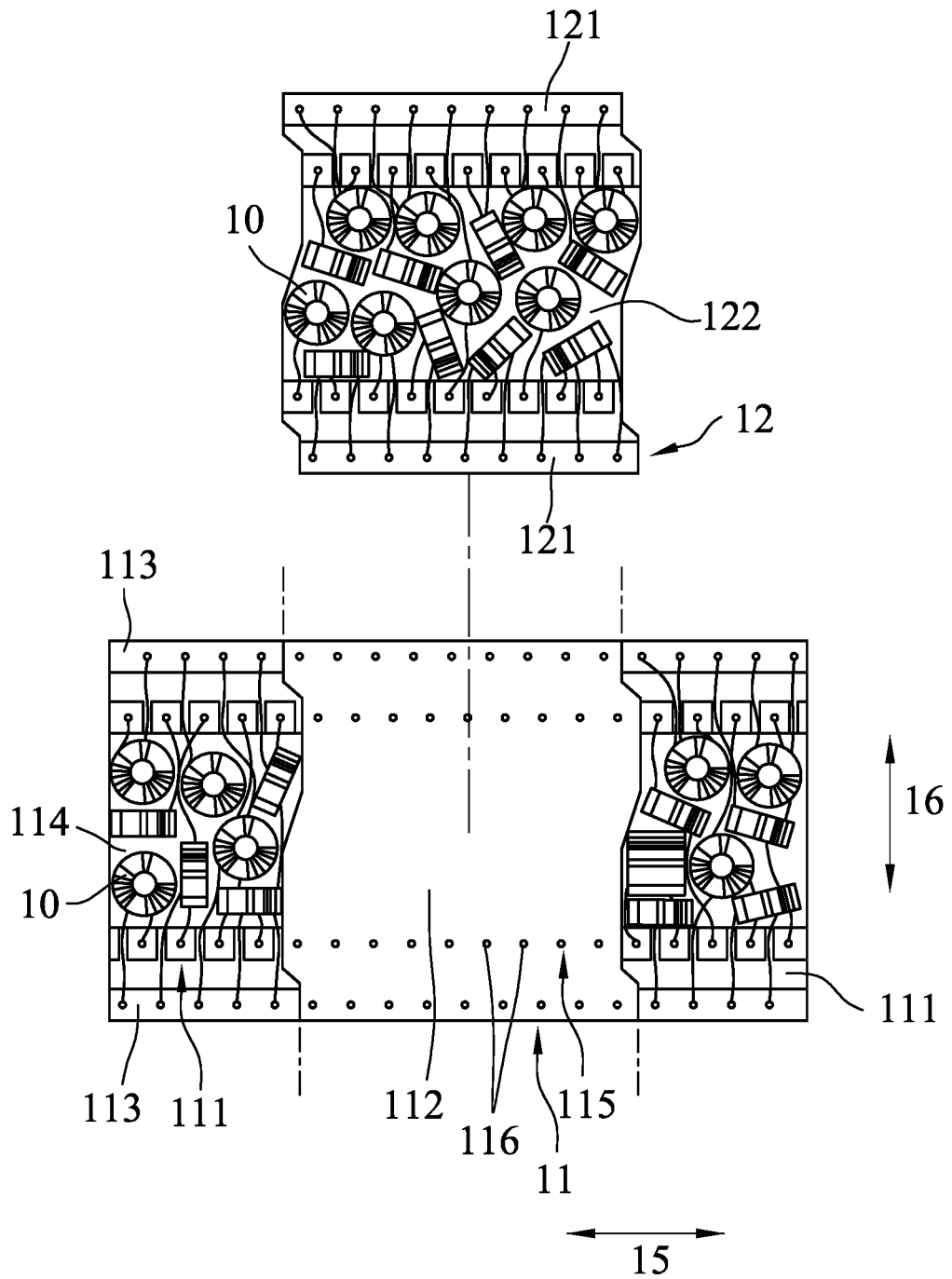
FIG. 2 is an exploded top view of the conventional electronic device packaging box, with a cover removed.

Before the disclosure is described in greater detail, it should be noted that where considered appropriate, reference numerals or terminal portions of reference numerals have been repeated among the figures to indicate corresponding or analogous elements, which may optionally have similar characteristics.

Figure 3:
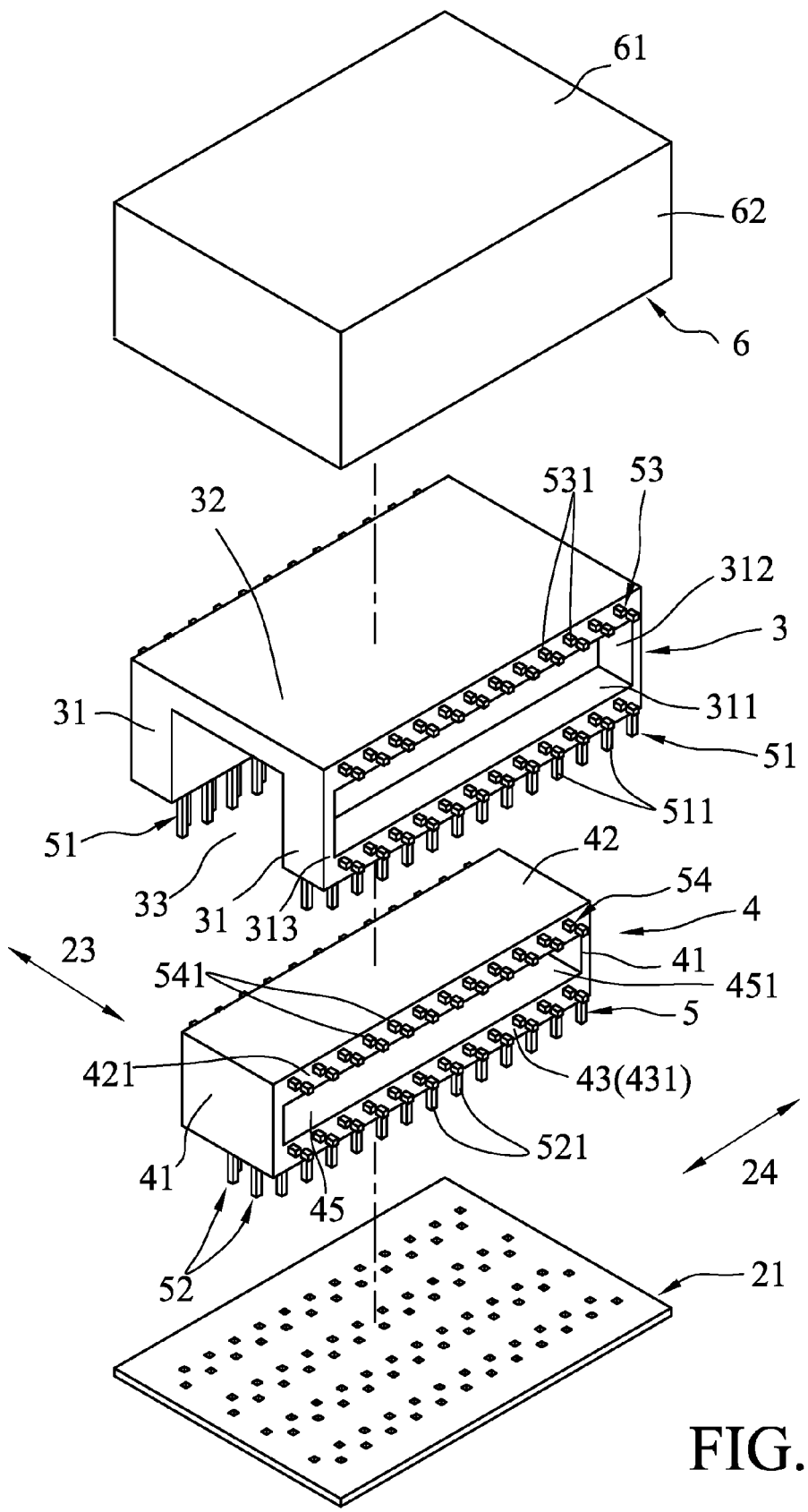
FIG. 3 is an exploded perspective view of an embodiment of an electronic device packaging box according to the present disclosure.
Figure 4:
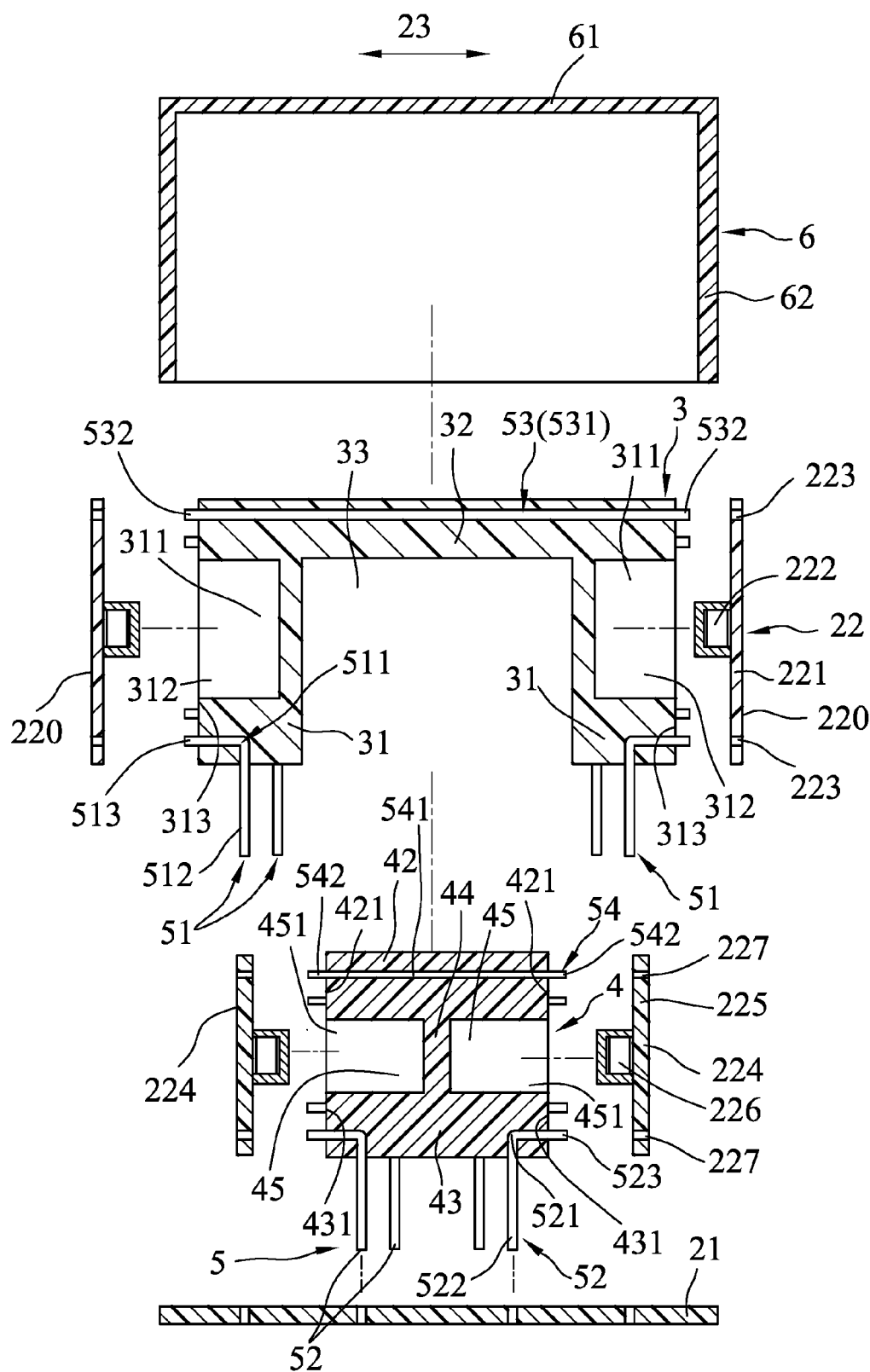
FIG. 4 is an exploded sectional view of the embodiment.
Figure 5:
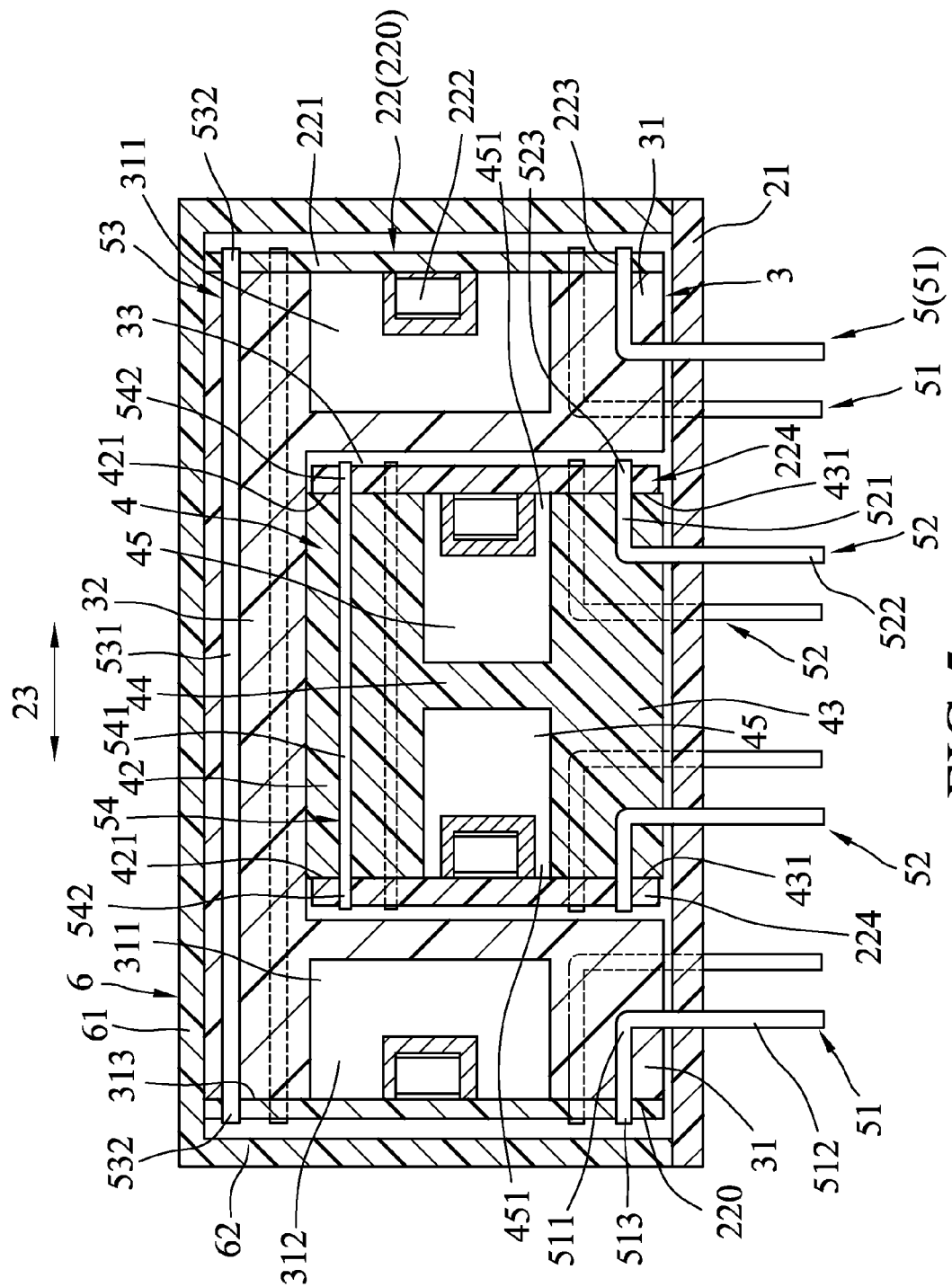
FIG. 5 is a sectional view of the embodiment.

Referring to FIGS. 3 to 5, an embodiment of an electronic device packaging box according to the present disclosure is adapted for electrically interconnecting a carrier plate 21 and an inductance unit 22.

The inductance unit 22 may be coil-type or shock-type. In this embodiment, the inductance unit 22 is illustrated as shock-type, and includes two first inductance subunits 220 and two second inductance subunits 224. The first inductance subunits 220 are spaced apart from the second inductance subunits 224 in a first direction 23. Each of the first inductance subunits 220 includes a first circuit board 221 that is perpendicular to the carrier plate 21 and that is formed with a plurality of first connecting holes 223 arranged in multiple vertical rows, and a plurality of first inductance members 222 that are mounted to the first circuit board 221. Each of the second inductance subunits 224 includes a second circuit board 225 that is perpendicular to the carrier plate 21 and that is formed with a plurality of second connecting holes 227 arranged in multiple vertical rows, and a plurality of second inductance members 226 that are mounted to the second circuit board 225.

The electronic device packaging box includes a first base 3, a second base 4, a connecting unit 5 and a cover 6.

The first base 3 includes two side walls 31, a connecting wall 32 and a receiving space 33. The side walls 31 are spaced apart from each other in a first direction 23. The connecting wall 32 interconnects upper ends of the side walls 31, and is parallel to the carrier plate 21. The receiving space 33 is defined by the side walls 31 and the connecting wall 32, and is adapted to open toward the carrier plate 21. Each of the side walls 31 has a first side receiving space 311. The first side receiving space 311 of one of the side walls 31 is spaced apart from the first side receiving space 311 of the other one of the side walls 31 in the first direction 23. The first side receiving space 311 of each of the side walls 31 has a first side opening 312. Each of the side walls 31 further has a surrounding side surface 313 that defines the first side opening 312 thereof.

The second base 4 is received in the receiving space 33 of the first base 3, and includes two end walls 41, a top wall 42, a bottom wall 43, a separating wall 44 and two second side receiving spaces 45. The end walls 41 are spaced apart from each other in a second direction 24, and are perpendicular to the carrier plate 21. The top wall 42 interconnects upper ends of the end walls 41, and is parallel to the carrier plate 21. The bottom wall 43 is spaced apart from the top wall 42, interconnects lower ends of the end walls 41, and is parallel to the carrier plate 21. The separating wall 44 is perpendicular to the carrier plate 21, and interconnects the end walls 41, the top wall 42 and the bottom wall 43. The second side receiving spaces 45 are defined by the end walls 41, the top wall 42, the bottom wall 43 and the separating wall 44, and are spaced apart from each other in the first direction 23. Each of the second side receiving spaces 45 has a second side opening 451 that opens toward a respective one of the side walls 31 of the first base 3. The bottom wall 43 of the second base 4 has two opposite side surfaces 431, each of which faces a respective one of the side walls 31 of the first base 3 and is proximate to the second side opening 451 of a respective one of the second side receiving spaces 45. The top wall 42 has two opposite side surfaces 421, each of which faces a respective one of the side walls 31 of the first base 3 and is proximate to the second side opening 451 of a respective one of the second side receiving spaces 45.

In this embodiment, the first direction 23 and the second direction 24 are perpendicular to each other.

The connecting unit 5 includes two first connecting subunits 51, two second connecting subunits 52, a first bridging unit 53 and a second bridging unit 54. Each of the first connecting subunits 51 is mounted to a respective one of the side walls 31 of the first base 3. The second connecting subunits 52 are mounted to the bottom wall 43 of the second base 4, and are spaced apart from the first connecting subunits 51 in the first direction 23. The first bridging unit 53 is mounted to the first base 3. The second bridging unit 54 is mounted to the top wall 42 of the second base 4. Each of the first connecting subunits 51 includes a plurality of first connecting members 511 that are spaced apart from each other in the second direction 24. Each of the first connecting members 511 of each of the first connecting subunits 51 has a first protruding section 513 parallel to the carrier plate 21, protruding from the surrounding side surface 313 of a corresponding one of the side walls 31, and adapted to be electrically connected to the inductance unit 22, and a first connecting section 512 that protrudes from the corresponding one of the side walls 31 and that is adapted to be electrically connected to the carrier plate 21. Each of the second connecting subunits 52 includes a plurality of second connecting members 521 that are spaced apart from each other in the second direction 24. Each of the second connecting members 521 of each of the second connecting subunits 52 has a second protruding section 523 parallel to the carrier plate 21, protruding from a corresponding one of the side surfaces 431 of the bottom wall 43, and adapted to be electrically connected to the inductance unit 22, and a second connecting section 522 that protrudes from the bottom wall 43 and that is adapted to be electrically connected to the carrier plate 21. The first bridging unit 53 includes a plurality of first bridging members 531 that are spaced apart from each other in the second direction 24. Each of the first bridging members 531 has two first projecting sections 532, each of which protrudes from the surrounding side surface 313 of a respective one of the side walls 31, and is adapted to be electrically connected to the inductance unit 22. The second bridging unit 54 includes a plurality of second bridging members 541 that are spaced apart from each other in the second direction 34. Each of the second bridging members 541 has two second projecting sections 542 that respectively protrude from the side surfaces 421 of the top wall 42, and that are adapted to be electrically connected to the inductance unit 22.

Referring to FIG. 3, the first connecting members 511 of each of the first connecting subunits 51 may be staggerly arranged. The second connecting members 521 of each of the second connecting subunits 52 may be staggerly arranged. The first bridging members 531 of the first bridging unit 53 may be staggerly arranged. The second bridging members 541 of the second bridging unit 54 may be staggerly arranged.

The cover 6 includes a top cover 61 that covers the connecting wall 32 of the first base 3, and two surrounding walls 62 that are spaced apart from each other in the first direction 23, that are respectively connected to opposite ends of the top cover 61 and that respectively cover the side walls 31 of the first base 3, such that access to the first side receiving spaces 311 of the side walls 31 is prevented.

At least one of the first side receiving spaces 311 of the side walls 31 and the second side receiving spaces 45 of the second base 4 is adapted for receiving at least a portion of the inductance unit 22 therein.

An assembly process of connecting the inductance unit 22 to this embodiment is described below. The first circuit board 221 of each of the first inductance subunits 220 is operated to abut against the surrounding side surface 313 of a corresponding one of the side walls 31 such that the first inductance members 222 of each of the first inductance subunits 220 are received in the first side receiving space 311 of the corresponding one of the side walls 31. Each of the first protruding section 513 of each of the first connecting members 511 of each of the first connecting subunits 51 and each of the first projecting sections 532 of each of the first bridging members 531 is inserted into a corresponding one of the first connecting holes 223 of a corresponding one of the first inductance subunits 220 so that the first inductance subunits 220 are electrically connected to the carrier plate 21 through the first connecting subunits 51 and the first bridging unit 53. Similarly, the second circuit board 225 of each of the second inductance subunits 224 is operated to abut against a corresponding one of the side surfaces 421 of the top wall 42 of the second base 4 and a corresponding one of the side surfaces 431 of the bottom wall 43 of the second base 4 such that the second inductance members 226 of each of the second inductance subunits 224 are received in a corresponding one of the second side receiving spaces 45 of the second base 4. Each of the second protruding section 523 of each of the second connecting members 521 of each of the second connecting subunits 52 and the second projecting sections 542 of each of the second bridging members 541 is inserted into a corresponding one of the second connecting holes 227 of a corresponding one of the second inductance subunits 224 so that the second inductance subunits 224 are electrically connected to the carrier plate 21 through the second connecting subunits 52 and the second bridging unit 54.

Figure 6:
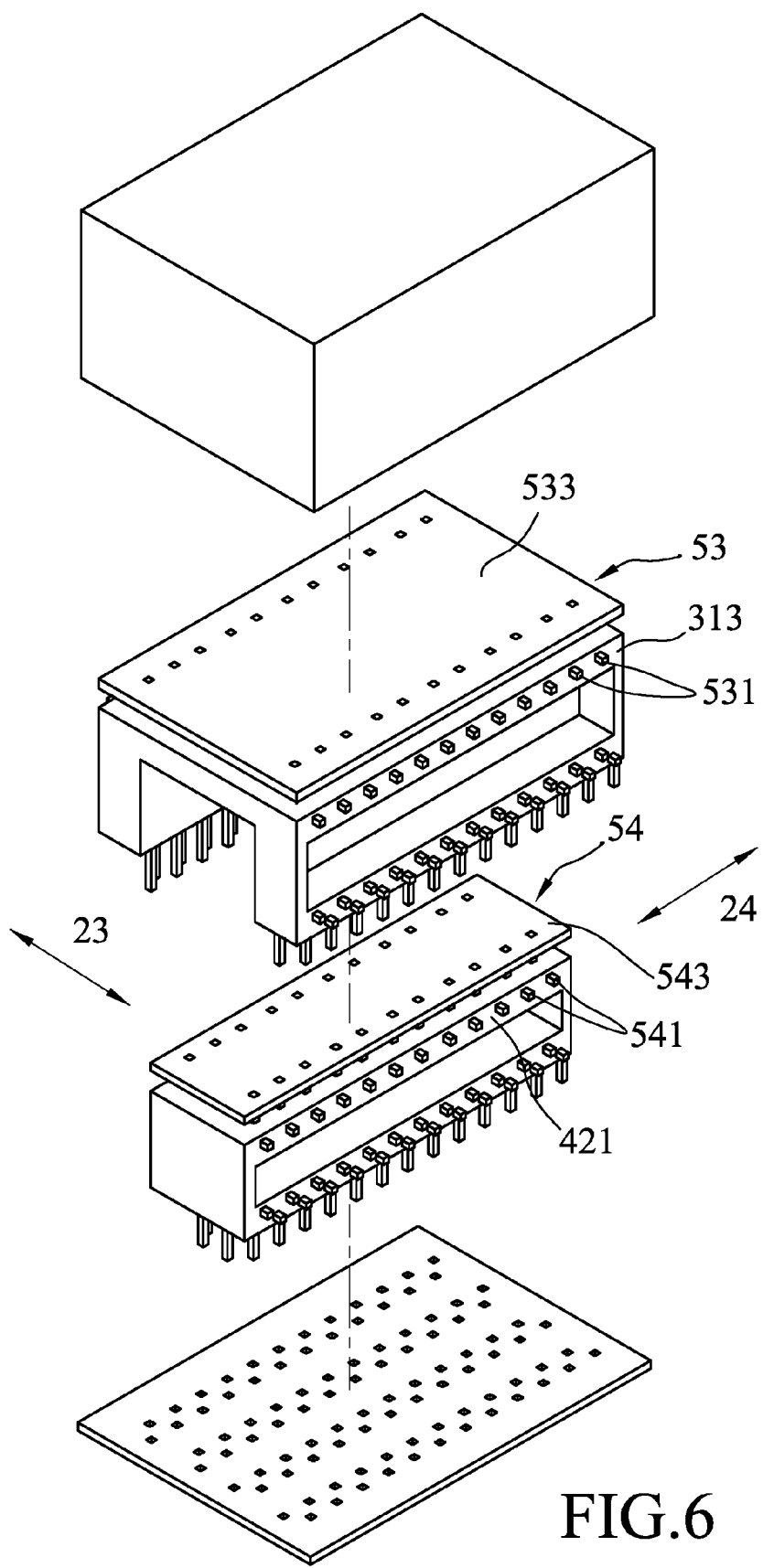
FIG. 6 is an exploded perspective view of a variation of the embodiment.
Figure 7:
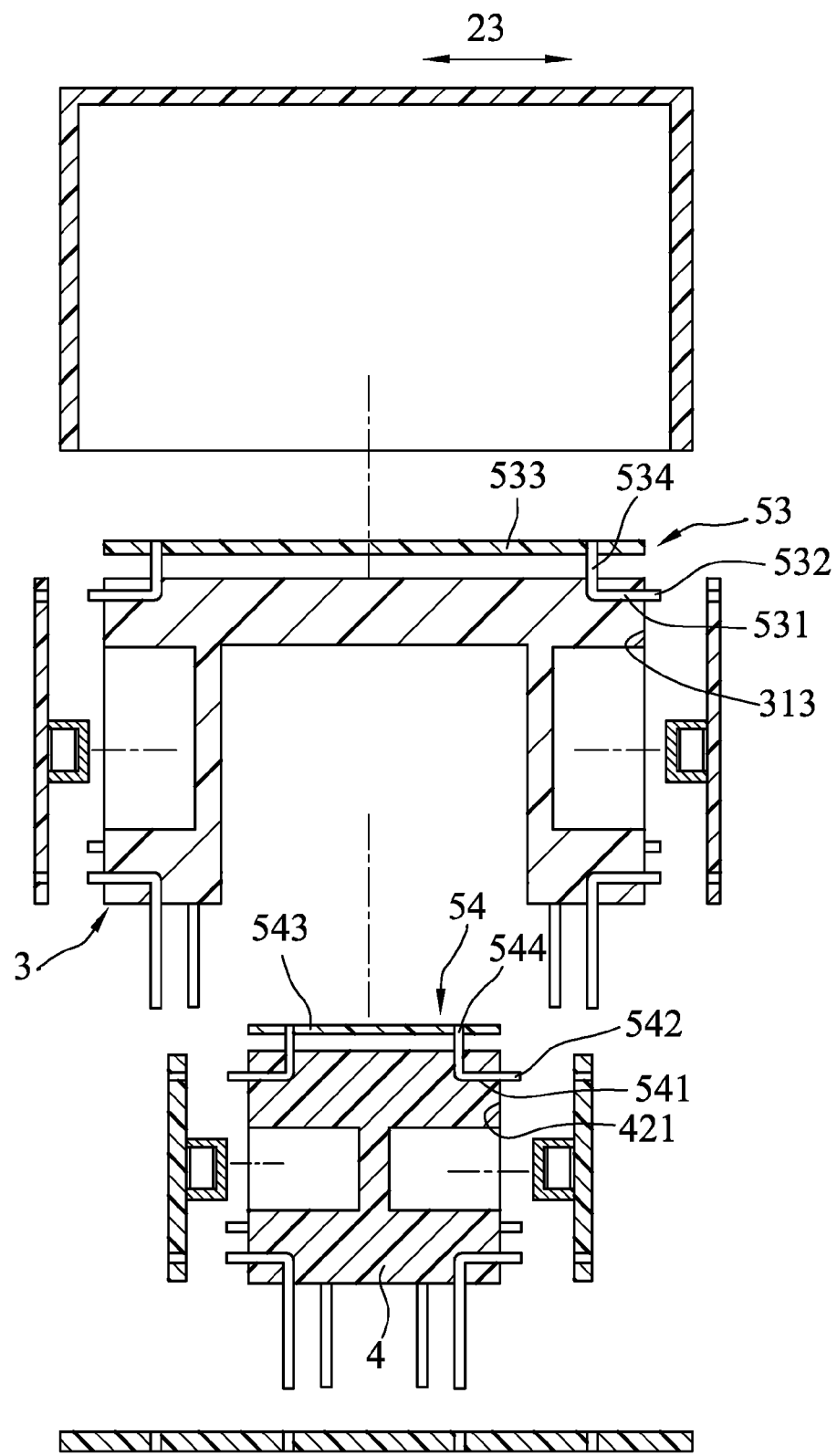
FIG. 7 is an exploded sectional view of the variation.

Referring to FIGS. 6 and 7, a variation of the embodiment according to the present disclosure is shown. In the variation, the first bridging unit 53 includes a plurality of the first bridging members 531 that are spaced apart from each other in the second direction 24, and a first connecting plate 533 that is electrically connected to the first bridging members 531. Each of the first bridging members 531 has the first projecting section 523 that protrudes from the surrounding side surface 313 of a corresponding one of the side walls 31, and a first mounting section 534 that is electrically connected to the first connecting plate 533. The second bridging unit 54 includes a plurality of the second bridging members 541 that are spaced apart from each other in the second direction 24, and a second connecting plate 543 that is electrically connected to the second bridging members 541. Each of the second bridging members 541 has the second projecting section 542 that protrudes from a corresponding one of the side surfaces 421 of the top wall 42, and a second mounting section 544 that is electrically connected to the second connecting plate 543.

To sum up, with the second base 4 received in the receiving space 33 of the first base 3, the electronic device packaging box of this disclosure occupies less area of the carrier plate 21 than the conventional electronic device packaging box 1 (see FIG. 1).

In the description above, for the purposes of explanation, numerous specific details have been set forth in order to provide a thorough understanding of the embodiment and variation. It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects.

While the disclosure has been described in connection with what are considered the exemplary embodiment and variation, it is understood that this disclosure is not limited to the disclosed embodiment and variation but is intended to cover various arrangements included within the spirit and scope of the broadest interpretation so as to encompass all such modifications and equivalent arrangements.

What is claimed is:

1. An electronic device packaging box adapted for electrically interconnecting a carrier plate and an inductance unit, said electronic device packaging box comprising:
    a first base including
        two side walls that are spaced apart from each other in a first direction, and that each have a first side receiving space,
        a connecting wall that interconnects said side walls, and
        a receiving space that is defined by said side walls and said connecting wall, and that is adapted to open toward the carrier plate;
    a second base being received in said receiving space of said first base, and including
        a top wall,
        a bottom wall that is spaced apart from said top wall,
        a separating wall that interconnects said top wall and said bottom wall, and
        two second side receiving spaces that are defined by said top wall, said bottom wall and said separating wall, and that are spaced apart from each other in the first direction; and
    a connecting unit including two first connecting subunits and two second connecting subunits, each of said first connecting subunits being mounted to a respective one of said side walls of said first base, said second connecting subunits being mounted to said bottom wall of said second base and being spaced apart from said first connecting subunits in the first direction, each of said first connecting subunits including a plurality of first connecting members that are spaced apart from each other in a second direction, each of said second connecting subunits including a plurality of second connecting members that are spaced apart from each other in the second direction,
    wherein at least one of said first side receiving spaces of said side walls and said second side receiving spaces of said second base is adapted for receiving at least a portion of the inductance unit therein.

2. The electronic device packaging box as claimed in claim 1, wherein said first side receiving space of each of said side walls has a first side opening, each of said side walls further having a surrounding side surface that defines said first side opening thereof, each of said first connecting members of each of said first connecting subunits having a first protruding section that protrudes from said surrounding side surface of a corresponding one of said side walls and that is adapted to be electrically connected to the inductance unit, and a first connecting section that is adapted to be electrically connected to the carrier plate.

3. The electronic device packaging box as claimed in claim 2, wherein each of said second side receiving spaces has a second side opening that opens toward a respective one of said side walls of said first base, said bottom wall of said second base having two opposite side surfaces, each of which faces a respective one of said side walls of said first base and is proximate to said second side opening of a respective one of said second side receiving spaces, each of said second connecting members of each of said second connecting subunits having a second protruding section that protrudes from a corresponding one of said side surfaces of said bottom wall and that is adapted to be electrically connected to the inductance unit, and a second connecting section that is adapted to be electrically connected to the carrier plate.

4. The electronic device packaging box as claimed in claim 3, wherein said top wall of said second base has two opposite side surfaces, each of which faces a respective one of said side walls of said first base and is proximate to said second side opening of a respective one of said second side receiving spaces, said connecting unit further including a first bridging unit that is mounted to said first base and a second bridging unit that is mounted to said top wall of said second base, said first bridging unit including a plurality of first bridging members that are spaced apart from each other in the second direction, each of said first bridging members having two first projecting sections, each of which protrudes from said surrounding side surface of a respective one of said side walls and is adapted to be electrically connected to the inductance unit, said second bridging unit including a plurality of second bridging members that are spaced apart from each other in the second direction, each of said second bridging members having two second projecting sections that respectively protrude from said side surfaces of said top wall and that are adapted to be electrically connected to the inductance unit.

5. The electronic device packaging box as claimed in claim 3, wherein said top wall has two side surfaces, each of which faces a respective one of said side walls of said first base and is proximate to said second side opening of a respective one of said second side receiving spaces, said connecting unit further including a first bridging unit that is mounted to said first base and a second bridging unit that is mounted to said top wall of said second base, said first bridging unit including a plurality of first bridging members that are spaced apart from each other in the second direction and a first connecting plate that is electrically connected to said first bridging members, each of said first bridging members having a first projecting section that protrudes from said surrounding side surface of a corresponding one of said side walls and a first mounting section that is electrically connected to said first connecting plate, said second bridging unit including a plurality of second bridging members that are spaced apart from each other in the second direction and a second connecting plate that is electrically connected to said second bridging members, each of said second bridging members having a second projecting section that protrudes from a corresponding one of said side surfaces of said top wall and a second mounting section that is electrically connected to said second connecting plate.

6. The electronic device packaging box as claimed in claim 1, wherein the first direction and the second direction are perpendicular to each other.

7. The electronic device packaging box as claimed in claim 1, further comprising a cover that covers said first base such that access to said first side receiving spaces of said side walls is prevented.

* * * * *